(12) United States Patent
Osecky et al.

(10) Patent No.: US 6,792,550 B2
(45) Date of Patent: Sep. 14, 2004

(54) METHOD AND APPARATUS FOR PROVIDING CONTINUED OPERATION OF A MULTIPROCESSOR COMPUTER SYSTEM AFTER DETECTING IMPAIRMENT OF A PROCESSOR COOLING DEVICE

(75) Inventors: Benjamin D. Osecky, Fort Collins, CO (US); Blaine D. Gaither, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 603 days.

(21) Appl. No.: 09/775,404

(22) Filed: Jan. 31, 2001

(65) Prior Publication Data

US 2002/0101715 A1 Aug. 1, 2002

(51) Int. Cl.[7] .................................................. G06F 1/00
(52) U.S. Cl. ............................ 713/300; 714/3; 361/695
(58) Field of Search ........................ 324/511; 340/584; 361/695; 702/132; 714/3; 713/300

(56) References Cited

U.S. PATENT DOCUMENTS

| | | | |
|---|---|---|---|
| 5,798,918 A | * 8/1998 | Georgiou et al. | ............. 700/28 |
| 5,940,785 A | * 8/1999 | Georgiou et al. | ........... 702/132 |
| 5,977,733 A | * 11/1999 | Chen | ......................... 318/434 |
| 5,986,882 A | * 11/1999 | Ekrot et al. | .................. 361/687 |
| 6,020,820 A | * 2/2000 | Chiang | ....................... 340/584 |
| 6,101,459 A | * 8/2000 | Tavallaei et al. | ............ 702/132 |
| 6,243,656 B1 | * 6/2001 | Arai et al. | .................. 702/132 |
| 6,407,672 B1 | * 6/2002 | Grenz et al. | ................. 340/635 |
| 6,534,995 B1 | * 3/2003 | Schell et al. | ................. 324/511 |
| 6,614,655 B2 | * 9/2003 | Nakagawa et al. | ......... 361/687 |

FOREIGN PATENT DOCUMENTS

JP          11191016 A  *  7/1999  ............. G06F/1/00

OTHER PUBLICATIONS

Hewlett–Packard Whitepaper, "HP Server RP8400", Aug. 2002.*

David Hanrahan, "Fan Speed Control Techniques in PCs", Analog Dialogue, vol. 34, No. 4, Jun.–Jul. 2000.*

* cited by examiner

Primary Examiner—Thomas Lee
Assistant Examiner—Albert Wang
(74) Attorney, Agent, or Firm—David A. Plettner

(57) ABSTRACT

A multiprocessor computer system continues operation after the failure of a cooling device coupled to a central processing unit (CPU). In accordance with the present invention, an impending failure of a cooling device is detected, and all user and operating system processes are moved from the affected CPU coupled to the failing cooling device to one or more other CPUs. The system state is then altered so that interrupts are no longer received and processed by the affected CPU, and all memory caches associated with the affected CPU are flushed back to main memory to ensure cache coherency. At this point, the CPU is either powered-down, or placed in a low-power mode that allows the CPU to operate without the cooling device, while the processes that were removed from the suspended CPU continue executing on other CPUs. After the cooling device has been replaced and is operating normally, the CPU can be powered back up, interrupts can be enabled, and the CPU can once again execute user and operating system processes.

25 Claims, 2 Drawing Sheets

METHOD AND APPARATUS FOR PROVIDING CONTINUED OPERATION OF A MULTIPROCESSOR COMPUTER SYSTEM AFTER DETECTING IMPAIRMENT OF A PROCESSOR COOLING DEVICE

CROSS REFERENCE TO RELATED APPLICATION

This application contains subject matter related to a co-pending application entitled "A Method and Apparatus for Clearing Obstructions from Computer System Cooling Fans" by Benjamin D. Osecky et al., which has been assigned Hewlett-Packard Docket Number 10011795-1. This application is hereby incorporated by reference, is assigned to the same assignee as the present application, and was filed on Jan. 31, 2001, which is also the date on which the present application was filed.

FIELD OF THE INVENTION

The present invention relates to processor cooling in highly available multiprocessor computer systems. More specifically, the present invention relates to detecting the impending failure of a processor cooling device, suspending processes executing on the processor cooled by the cooling device, resuming execution of the processes on one or more other processors, and reducing power to the affected processor.

DESCRIPTION OF THE RELATED ART

In the art of computing, it is desirable to maximize the availability of a computer system. This is known in the art as high availability (HA) computing. Companies desiring to market HA computing systems have set very high goals. For example, Hewlett-Packard Company has announced a goal of achieving 99.999% availability for high-end server platforms. This translates to about five minutes of downtime per year.

The design of an HA computer encompasses many of the computer's subsystems. For example, redundant and uninterruptible power supplies, error correcting memories, disk array subsystems, and robust software are all critical to the design of an HA computer system.

One popular redundancy technique is known in the art as "N+1" redundancy. The concept behind N+1 redundancy is that if N devices are needed to operate a system, N+1 devices are provided. If one of the devices fails, the failure is detected and the failed device can be replaced before one of the other devices fails. N+1 redundancy has been used successfully to provide redundancy for power supplies, hard disk drives in disk array subsystems, as well as many other devices.

N+1 redundancy has also been used to provide redundant cooling to processors in multiprocessor computer systems. For example, if three cooling fans are required to cool the processors, a forth fan is provided. Typically, some type of manifold or plenum is used to direct the airflow to heat sinks attached to the processors. If one of the fans fails, the failure is detected and signaled to the operator. Thereafter, the failing fan can be replaced. Note that the computer system can continue operating without interruption.

In computing systems where high availability is less important, such as desktop workstations, it has become common to use a turbo cooler fan coupled directly to each processor. One popular line of turbo cooler fans is the ArctiCooler family of turbo cooler fans, which are a product of Agilent Technologies, Inc. Of course, turbo cooler fans are also available from many other companies.

Typically a heat sink is coupled to the processor using a thermal interface material, and the fan is mounted to the heat sink. Turbo coolers have several advantages. First, turbo coolers are very effective since the fan is mounted in close proximity with the processor and heat sink. Second, the turbo cooler is often integrated with the heat sink and processor to form a single field replaceable unit. Third, high-end turbo coolers have become highly reliable, and often have low failure rates that are comparable to the processor itself. Fourth, turbo coolers are volumetrically efficient because they require little space, and manifolds or plenums are not required. Finally, turbo coolers are inexpensive. As is known in the art, there are substantial competitive forces to continually lower the cost of computer systems.

While turbo coolers have proven to be an inexpensive, efficient, and reliable solution to the problem of processor cooling, the use of turbo coolers in HA computer systems has proven to be controversial because the failure of a single turbo cooler fan has the potential to bring down the whole computer system. Accordingly, what is needed in the art is a way to use turbo coolers to cool processors, while providing the level of redundancy traditionally associated with providing N+1 cooling fans.

SUMMARY OF THE INVENTION

The present invention allows a multiprocessor computer system to continue operation after the failure of a non-redundant turbo cooler fan, or other non-redundant per-processor cooling device, that is coupled to a central processing unit (CPU). The present invention is implemented via several hardware and software components. The hardware components include a cooling device monitoring and control unit which monitors one or more signals indicative of cooling device health, and the ability to deallocate a CPU.

The software components include routines that interface with the cooling device monitoring and control unit and deallocation hardware, and provide the ability to detect an impending cooling device failure. If an impending failure is detected, the software components cause all user and operating system processes to be moved from the CPU coupled to the failing cooling device to one or more other CPUs. The system state is altered so that interrupts are no longer received and processed by the affected CPU, and all memory caches associated with the affected CPU are flushed back to main memory to ensure cache coherency.

At this point, the CPU is either powered-down, or placed in a low-power mode that allows the CPU to operate without the cooling device. The system operator or other management software is then notified that the cooling device has failed. Note that the field replaceable unit may be the fan only, a fan/heat sink assembly, or a fan/heat sink/CPU assembly. After the cooling device has been replaced and is operating normally, the CPU can be powered back up, interrupts can be enabled, and the CPU can once again be available to execute user and operating system processes.

The present invention allows a multiprocessor computer system to be constructed with non-redundant, efficient, low cost, and highly effective turbo cooler fans or other types of non-redundant cooling devices, while ensuring continued operation of the computer system in the event of a failure of a cooling device. Accordingly, the present invention is ideally suited for use in low-cost high availability computer systems. In essence, the present invention moves the point of redundancy from the cooling device to the redundancy provided by other CPUs in a multiprocessor computer system.

DETAILED DESCRIPTION OF THE PREFERRED EMBODIMENTS

The present invention allows a multiprocessor computer system to continue operation after the failure of a non-redundant turbo cooler fan, or other type of non-redundant per processor cooling device, that is coupled to a central processing unit (CPU). When the present invention detects the impending failure of a cooling device, the present invention first causes all user and operating system processes to be moved from the CPU coupled to the failing cooling device to one or more other CPUs. Next, the system state is altered so that interrupts are no longer received and processed by the affected CPU. In addition, all memory caches associated with the affected CPU are flushed to ensure cache coherency. At this point, the CPU is either powered-down, or placed in a low-power mode that allows the CPU to operate without the cooling device. The system operator or other management software is then notified that the cooling device has failed. After the turbo cooler has been replaced and is operating normally, the CPU can be powered back up, interrupts can be enabled, and the CPU is once again available to execute user and operating system processes.

Figure 1:
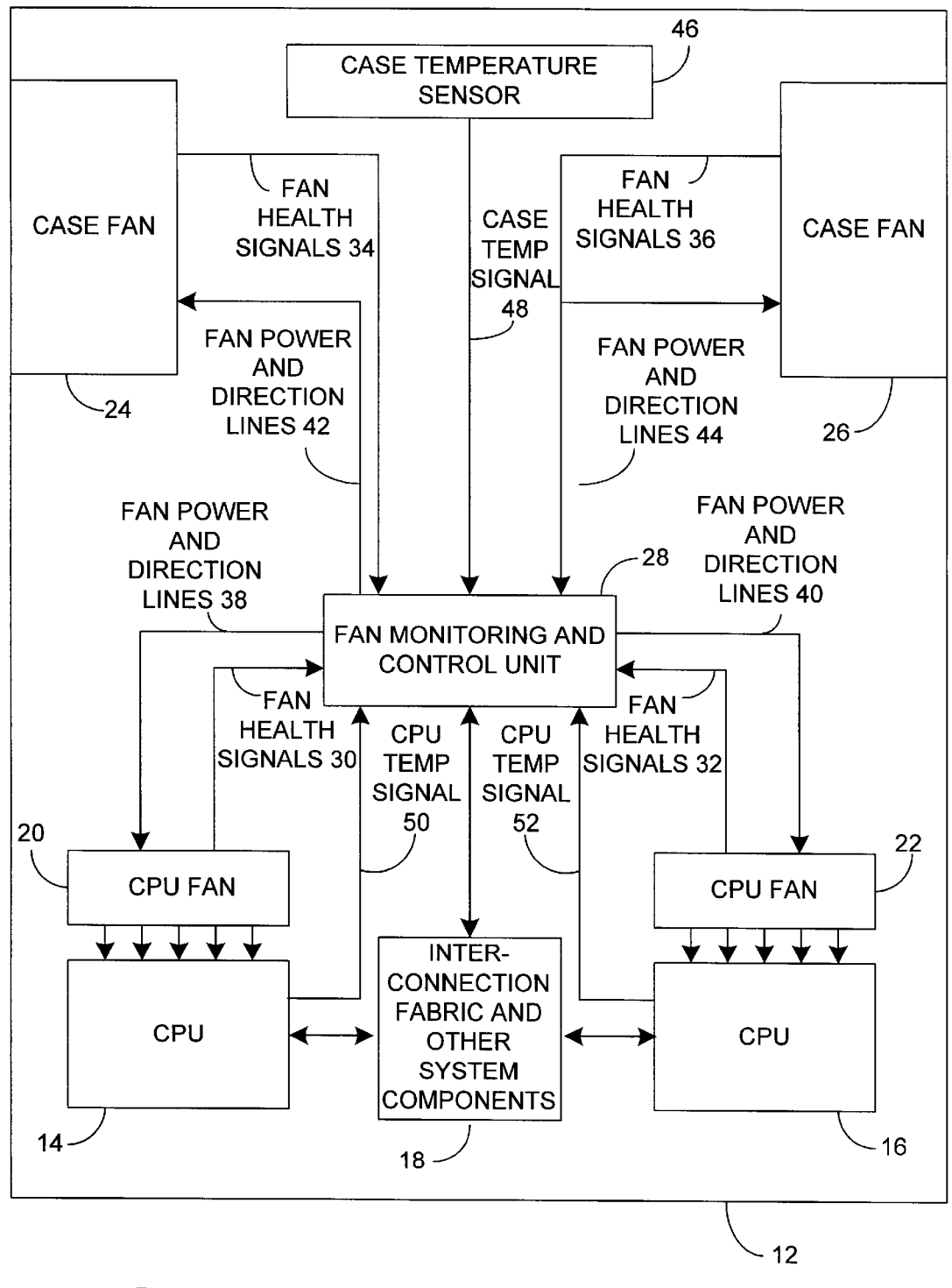
FIG. 1 is a block diagram of a multiprocessor computer system and illustrates the hardware components of the present invention.

The present invention is implemented via several hardware and software components. FIG. 1 is a block diagram of a computer system 10 that includes the hardware components of the present invention. Computer system 10 is a multiprocessor computer system having CPUs 12 and 14. Although system 10 is shown as having only two CPUs, those skilled in the art will recognize that the present invention may be used in a multiprocessor computer system having any number of processors. As a matter of fact, the present invention works especially well in computers having a large number of CPUs because the loss of a single CPU represent a smaller fraction of the computer system's total capacity.

CPUs 12 and 14 are coupled by interconnection fabric 16. Typically the interconnection fabric will be provided by a motherboard that couples the CPUs to a chipset. However, other interconnection fabrics may be used, such as crossbar-based or ring-based interconnection fabrics. Interconnection fabric 16 also includes CPU power and interrupt unit 17, which is capable of powering down each CPU or placing each CPU in a low power mode, and disabling interrupts to each CPU. In addition, if it is desired to have the capability to replace a CPU while computer 10 continues operating, unit 17 can be provided with the capability of electronically disconnecting all required signals from the CPU to allow the CPU to be replaced.

Also connected to interconnection fabric 16 is memory controller unit 18. Memory controller unit 18 is also connected to cache memory unit 20 via bus 22, which in turn is connected to main memory unit 24 via bus 26. Other computer components 19 are also coupled to interconnection fabric 16. Box 19 represents other devices commonly found in a computer system, such as persistent storage, I/O units, video controllers, and the like. However, these components need not be illustrated to understand the operation of the present invention.

In FIG. 1, each CPU is cooled by a non-redundant per-CPU cooling device, such as a turbo cooler fan, a cryogenic cooler, a refrigerative cooler, a water cooler, or a peltier coolers. Accordingly, CPU 12 is cooled by cooling device 28 and CPU 14 is cooled by cooling device 30. Cooling device monitoring and control unit 32 supplies power to cooling device 28 via cooling device power line 34, and supplies power to cooling device 30 via cooling device power line 36. Unit 32 also monitors the operation of cooling device 28 via cooling device health signals 38, and monitors the operation of cooling device 30 via cooling device health signals 40. In addition, cooling device monitoring and control unit 32 also monitors the temperature of the CPUs. The temperature of CPU 12 is provided to unit 32 via CPU temperature signal 42, and the temperature of CPU 14 is provided to unit 32 via CPU temperature signal 44. Cooling device monitoring and control unit 32 is also coupled to interconnection fabric 16 to allow the status of the cooling devices to be observed by software routines, and to allow software routines to control the operation of the cooling devices, which will be discussed in greater detail below.

Cooling device monitoring and control unit 32 can monitor the health of the cooling device in a variety of ways. Note that one implementing the present invention may choose any one of these methods, or may choose a combination of methods.

One indication of impending cooling failure is the temperature of the CPU itself. It is known in the art to integrate a temperature sensing device within the CPU, or to provide an external sensor in thermal contact with the CPU. CPU temperature signals 42 and 44 provide the temperatures of CPUs 12 and 14, respectively, to cooling device monitoring and control unit 32. Note that if the temperature device is integrated within the CPU, it may be necessary to retrieve the CPU temperature by executing an appropriate instruction sequence on the CPU.

Several temperature bands can be used. For example, if the CPU temperature is in a "green" temperature band, then the CPU can be considered to be operating normally. If the CPU temperature is in a higher "yellow" temperature band, then it can be assumed that the cooling device is failing, and the CPU can be deallocated in an orderly manner and powered down. Finally, if the CPU temperature is in an even higher "red" temperature band, the CPU can be powered down immediately. Of course, if the present invention is properly implemented, the CPU temperature should never reach the "red" temperature band because the CPU would have been deallocated and powered down before reaching a critical temperature. However, if the CPU did reach the "red" temperature band for some reason, such as a program error in the monitoring software, provision can be made to immediately power down the computer system to avoid damage and reduce the risk of fire.

Note that CPU temperatures can also be used to identify other types of failures. For example, a steady rise in the temperature of all CPUs may indicate an obstruction that is blocking the airflow into or out of the computer case, or may indicate a failure of the air conditioning system in the computer room.

Cooling device power lines 34 and 36 provide power from cooling device monitoring and control unit 32 to cooling devices 28 and 30, respectively. In addition, lines 34 and 36 provide measurement and control functions, as will be described below. As mentioned above, if a cooling device fails, the cooling device can be powered down by unit 32 after the CPU has been deallocated. In addition, unit 32 can monitor the current supplied to each cooling device. In the case of turbo cooler fans, experience has shown that increases or decreases in fan motor current can be used to accurately predict impending fan failure.

Cooling device health signals 38 and 40 represent any other type of cooling device health monitoring method that may be used with the present invention. For example, a fan tachometer may be used to measure the speed of a turbo cooler fan. The tachometer may be implemented with an optical sensor, a magnetic pickup, or any other technique known in the art.

The health of the cooling device can also be monitored with an acoustic sensor. Such a sensor may comprise a microphone mounted proximate the cooling device and coupled to a signal processor that generates an acoustic profile of the cooling device during normal operation. Any detected deviation from the normal acoustic profile can be used as an indication of impending cooling device failure.

Of course, other types of signals may also be used to detect impending cooling device failure, such as a signal that indicates the temperature or flow rate of air leaving the heat sink of a turbo cooler fan, or a signal that indicates the compressor pressure, coolant pressure, coolant flow rate, compressor speed, or heat exchanger temperature associated with a cryogenic cooler.

Note that cooling device monitoring and control unit 32 is coupled to interconnection fabric 16. This connection is shown to generically represent the ability of a program, which may reside in firmware or may be part of the operating system, to monitor the health of the cooling devices. Of course, this connection may be provided in many ways known in the art, such as a memory-mapped address space, a DMA channel, an I²C bus, a serial bus, a universal serial bus (USB), or other signaling method. Note that unit 32 could also be configured to detect that preset-thresholds have been exceeded, and issue an interrupt to signal an impending failure to firmware or the operating system.

As mentioned above, one implementing the present invention may choose any one of these methods, or may choose a combination of methods. Note that a combination of methods may provide additional advantages. For example, assume that a sudden drop in fan rotation speed is detected in a turbo cooler fan, but CPU temperature remains normal. In this situation, it is likely that the speed sensor has malfunctioned because the CPU is still being cooled. An aggressive, course of action that maximizes computing capacity would be to signal the operator or management software that the cooling device current sensor has failed, but allow the CPU to continue normal operation. A conservative course of action that maximizes the probability that the system will remain available would be to deallocate the CPU. If three or more detection methods are used, then "voting" can be used to only deallocate the CPU if two or more methods signal an impending failure. Accordingly, having multiple methods of sensing the health of the cooling device allows the system to tolerate the failure any particular method (such as the current sensor) without having to deallocate the CPU.

Conversely, if fan motor current or fan speed remains normal, but a sudden increase in CPU temperature is detected, it is possible that the CPU has suffered some type of malfunction that has caused additional power to be dissipated. In this situation, it would still be wise to deallocate the CPU. However, the operator could be notified that the most likely cause of the failure is the CPU, and not the cooling device. Accordingly, having multiple methods of sensing the health of the cooling device allows the system to better diagnose the root cause of the problem.

Furthermore, the use of multiple sensing methods can allow the computer system to continue operating during extreme environmental conditions. For example, if cooling device airflow is partially blocked, multiple sensors may allow monitoring software to determine that the CPU is still being adequately cooled and therefore does not need to be deallocated.

Finally, having multiple sensors may be able to enhance predictive capability. For example, a fan speed sensor may indicate that the fan speed has increased slightly, but not enough to definitively conclude that the fan will fail. In this case, it might be desirable to monitor the CPU temperature for confirmation. Based on the change in fan speed, it may also be desirable to lower the temperature threshold at which the determination is made to deallocate the CPU.

Figure 2:
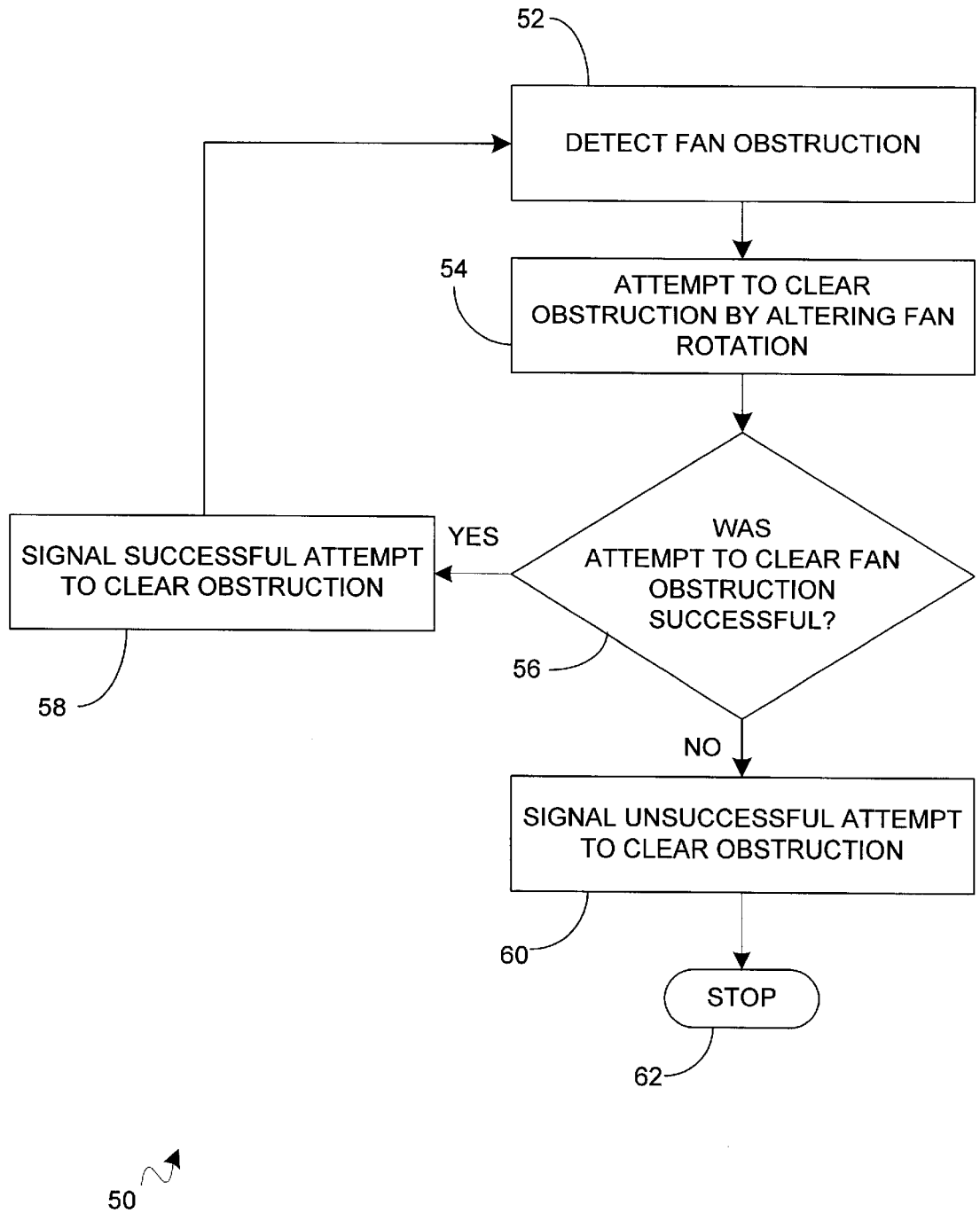
FIG. 2 is a flowchart illustrating the software components of the present invention.

FIG. 2 is a flowchart 46 illustrating the software components of the present invention. At block 48 of flowchart 46, an impending failure of a cooling device coupled to a CPU is detected using one or more of the methods described above. Note that the software code that implements block 48 can be provided by firmware routines that communicate with cooling device monitoring and control unit 32, and a programming interface can be used to pass failure information to the operating system. Alternatively, the code that implements block 48 can be provided by a platform specific driver or library. Another option is to allow the impending failure be detected by software executing within unit 32, with unit 32 signaling the firmware or operating system by issuing an interrupt, as described above. After the impending failure is detected at block 48, control passes to block 50.

At block 50, the operating system suspends all user and operating system processes executing on the affected CPU in a manner that allows execution of the processes to resume on one of the remaining CPUs. Since block 48 will typically detect an impending failure well in advance of the CPU reaching a critical temperature, the operating system can allow each process to finish executing its current time slice before moving the process to another CPU. Alternatively, in a priority based preemptive scheduling environment, the detection of an impending cooling system failure can result in the immediate suspension of user and operating system processes. Note that execution of suspended process can resume immediately on the remaining CPUs, and execution can continue on the remaining CPUs until the problem is corrected and the affected CPU is reallocated.

Next control passes to block 52, which halts processing of interrupts by the affected CPU. This is done by rerouting all interrupt vectors to ensure that interrupt service routines are not executed by the affected CPU, and by signaling CPU power and interrupt unit 17 of interconnection fabric 16 to block interrupts flowing to the affected CPU. Next, control passes to block 54, which flushes any cache lines held by the affected CPU back to main memory unit 24.

Control then passes to block 55, which powers down the affected CPU, or places the affected CPU in low power mode, and powers down the failing cooling device. This step is also done by signaling CPU power and interrupt unit 17 of interconnection fabric 16. In addition, cooling device monitoring and control unit 32 is signaled to power down the cooling device. Note that two different option are represented by this block. Using the first option, if the CPU and cooling device are completely powered down, unit 17 can also electronically disconnect all required signals provided to the CPU to allow both the cooling device and the CPU to be replaced. This option could be useful if the CPU is coupled to the cooling device as a field replaceable unit, or if the CPU itself has failed. Of course, if the CPU and the cooling device are separate field replaceable units, and the CPU has not failed, it is also possible to only replace the cooling device.

Using the second option, the cooling device is powered down, but the CPU is placed in a low power mode. Note that in this mode, the CPU must be capable of dissipating power at a low enough level to ensure that the CPU remains at an acceptable temperature without the aid of the cooling device. Many commercially available CPUs can operate in a low power mode. The low power mode can reduce power consumption in a number of ways, such as reducing the clock speed of the CPU, disabling CPU cache memories, or powering down portions of the CPU, such as the floating point unit or a second integer unit, when those portions of the CPU are not being used. Note that the second option can not be used if the CPU is coupled to the cooling device as a single field replaceable unit. However, if a cooling device is comprised of a heat sink and a fan, and the heat sink and fan are separate field replaceable units, it may be possible to leave the heat sink in place while the fan is replaced, thereby allowing the CPU to dissipate more heat than would be possible without the heat sink, and thereby providing the opportunity for the CPU to do additional work while in low power mode.

If it is desired to keep the CPU allocated in a low power mode, block 50 can be modified to not terminate the processes, but instead signal the operating system that the CPU is executing in low power mode and should not be used for intensive processing. Blocks 52 and 54 can be eliminated, although it may be wise to divert processor intensive interrupt handler routines to another CPU. In addition, the operating system should monitor the temperature of the affected CPU to ensure that it is operating within normal temperature ranges despite the loss of the cooling device. Also, at block 55, it may be desirable to allow the cooling device to continue operation, even though the effectiveness of the cooling device may be impaired.

After block 55, control passes to block 56, where the operator is notified of the failure. There are many way that this can be accomplished. For example, block 56 could create a visual and/or audio signal to attract the attention of the operator, and engage the operator in a replacement sequence dialog. Note that the field replaceable unit may be quite hot, so the operator should be warned that the field replaceable unit should be allowed to cool, or should be advised to use an insulated extraction device.

Block 56 could also call a pager of the operator, or send an email message to the vendor maintaining the system. Many types of notification are known in the art, and may advantageously be used with the present invention. These tasks can be performed by a process executing on a remaining CPU, or by dedicated service mode processor.

Next, at block 58 cooling device monitoring and control unit 32 waits for the failed cooling device to become functional. This can be accomplished by a technician replacing the failed cooling device, and engaging in a replacement dialog that notifies the operating system, or by a contact switch of other signaling method that determines that the field replaceable unit has been replaced. Unit 32 then restores power to the cooling device and verifies that the cooling device is functioning properly for a period of time before passing control to block 60.

The teachings included in a co-pending application entitled "A Method and Apparatus for Clearing Obstructions from Computer System Cooling Fans" by Benjamin D. Osecky et al., which is incorporated by reference above, may also be used at step 58. As disclosed in this application, it may be possible to clear a fan obstruction by manipulating the current supplied to the fan. For example, consider the following example. Many computer systems have labels affixed to the inside of a computer case using an adhesive backing. Over time, the adhesive backing may fail, and the label may become detached. If the label were to be drawn into a turbo cooler fan and completely obstruct the fan, the speed of the fan speed would immediately increase, and the temperature of the CPU would begin to rise. It may be possible to dislodge the label by stopping and starting the fan, or reversing the fan. If this is successful, then block 58 can monitor the cooling device for a period of time to ensure proper operation before passing control to block 60. Note that it may still be desirable to signal the operator so that the operator can remove the label from the computer case.

Next, block 60 restores power to the affected CPU, or changes the affected CPU from the low power mode to normal mode by signaling CPU power and interrupt unit 17. This can be accomplished by having cooling device monitoring and control unit 32 signal CPU power and interrupt unit 17, or by having operating system software or firmware executing on one of the remaining CPUs detect proper operation of the cooling device and signaling unit 17. Note that it may also be necessary to execute CPU or platform specific initialization code at block 60 to restore the CPU to normal operation.

Control then passes to block 62, which signals CPU power and interrupt unit 17 to direct interrupts to the affected CPU and signals the operating system that the CPU is available to begin executing processes. At this point, the operating system can also alter interrupt vectors to allowing the CPU to begin processing interrupt handler routines. Computer system 10 is now functioning normally, and control passes back to block 48 to wait for another impending failure of a cooling device to be detected.

While the present invention has been described with reference to continued operation in a multiprocessor computer system, the teaching included herein can also be adapted for use with a single processor system. For example, in one single CPU implementation, cooling device monitoring and control unit 32 could signal the operating system (either using a program interface provided by system firmware or a platform specific driver) to perform an orderly shutdown upon detecting the impending failure of the CPU cooling device. Such an implementation could leverage off of existing implementations of uninterruptible power supplies that provided limited battery backup in the event of a power failure, and signal the operating system to perform an orderly shut down before cutting off power to the computer system.

The present invention allows a multiprocessor computer system to be constructed with non-redundant, inexpensive, thermally and volumetrically efficient turbo cooler fans, while ensuring continued operation of the computer system in the event of a failure of a turbo cooler fan. Accordingly, the present invention is ideally suited for use in low-cost high availability computer systems. In essence, the present invention moves the point of redundancy from the turbo cooler fan to redundancy provided by other CPUs in a multiprocessor computer system.

Although the present invention has been described with reference to preferred embodiments, workers skilled in the art will recognize that changes may be made in form and detail without departing from the spirit and scope of the invention.

What is claimed is:

1. A method of continuing operation of a multiprocessor computer system comprising:
   detecting an impending failure of a cooling device coupled to an affected processor;
   suspending execution of affected processes executing on the affected processor by signaling an operating system to not schedule computationally intensive processes on the affected processor;
   prohibiting other processes from being executed by the affected processor;
   resuming execution of the affected processes on one or more other processors; and
   reducing power consumption of the affected processor to a level sufficient to maintain the affected processor at a non-critical temperature without assistance from the cooling device.

2. The method of claim 1 and further comprising:
   halting processing of interrupts by the affected processor; and
   flushing cache lines held by the affected processor to main memory.

3. The method of claim 1 wherein reducing power consumption of the affected processor to a level sufficient to maintain the affected processor at a non-critical temperature without assistance from the cooling device comprises powering down the affected processor.

4. The method of claim 1 wherein reducing power consumption of the affected processor to a level sufficient to maintain the affected processor at a non-critical temperature without assistance from the cooling device comprises placing the affected processor in a low power mode.

5. The method of claim 1 wherein the cooling device is a fan, and detecting an impending failure of a cooling device coupled to an affected processor comprises detecting a change in rotational speed of the fan.

6. The method of claim 1 wherein the cooling device is a fan, and detecting an impending failure of a cooling device coupled to an affected processor comprises detecting a change in current supplied to the fan.

7. The method of claim 1 and further comprising:
   generating a notification indicating that the impending failure has been detected and the affected processor has been deallocated.

8. The method of claim 1 and further comprising:
   powering down the cooling device;
   rectifying the impending or actual cooling device failure;
   powering up the cooling device;
   restoring power consumption of the affected processor to a normal level; and
   resuming execution of processes on the affected processor.

9. The method of claim 8 and further comprising:
   halting processing of interrupts by the affected processor after suspending execution of affected processes executing on the affected processor; and
   enabling the affected processor to process interrupts after restoring power consumption of the affected processor to a normal level.

10. A method of continuing operation of a multiprocessor computer system comprising:
    detecting an impending failure of a cooling device coupled to an affected processor;
    placing the affected processor in a low power mode that reduces power consumption of the affected processor to a level sufficient to maintain the affected processor at a non-critical temperature without assistance from the cooling device; and
    signaling an operating system to not schedule computationally intensive processes on the affected processor.

11. The method of claim 10 and further comprising:
    monitoring the temperature of the affected processor; and
    adjusting process scheduling to ensure that the affected processor does not reach a critical temperature while operating in the low power mode.

12. The method of claim 10 and further comprising:
    generating a notification indicating that the impending failure has been detected and the affected processor is operating in a reduced power mode.

13. The method of claim 10 and further comprising:
    powering down the cooling device;
    rectifying the impending or actual cooling device failure;
    powering up the cooling device;
    restoring power consumption of the affected processor to a normal level; and
    signaling the operating system that the affected processor is operating normally.

14. A computer system comprising:
    a plurality of processors;
    an operating system executing on one or more of the plurality of processors;
    an interconnection fabric coupled to the plurality of processors;
    a plurality of cooling devices, with each cooling device arranged to cool a processor;
    a processor power reduction unit coupled to each processor; and
    a cooling device monitoring and control unit coupled to the processor power reduction unit and configured to detect an impending failure of a cooling device that is coupled to an affected processor, wherein if an impending failure is detected, the cooling device monitoring and control unit:
      signals the operating system to suspend execution of affected processes being executed by the affected processor, prohibit other processes from being executed by the affected processor, and resume execution of the affected processes on one or more other processors; and
      signals the processor power reduction unit to reduce power consumption of the affected processor to a level sufficient to maintain the affected processor at a non-critical temperature without assistance from the cooling device.

15. The computer system of claim 14 and further comprising:
    one or more cache memories coupled to each processor;
    a main memory unit coupled to the one or more cache memories; and
    an interrupt unit coupled to each processor;

wherein the operating system, upon being signaled by the cooling device monitoring and control unit to suspend execution of affected processes being executed by the affected processor also signals the interrupt unit to disable interrupts to the affected processor, reroutes all interrupt vectors to ensure that interrupt service routines are not executed by the affected processor, and flushes cache lines held by the affected processor to the main memory unit.

16. The computer system of claim 14 wherein the processor power reduction unit reduces power consumption of the affected processor to a level sufficient to maintain the affected processor at a non-critical temperature without assistance from the cooling device by powering down the affected processor.

17. The computer system of claim 14 wherein the processor power reduction unit reduces power consumption of the affected processor to a level sufficient to maintain the affected processor at a non-critical temperature without assistance from the cooling device by placing the affected processor in a low power mode.

18. The computer system of 14 wherein the cooling devices are fans, each fan includes a rotational speed sensor coupled to the cooling device monitoring and control unit, and the cooling device monitoring and control unit detects an impending failure by detecting a change in rotational speed of the fan.

19. The computer system of 14 wherein the cooling devices are fans, a current sensor is coupled to each fan and the cooling device monitoring and control unit, and the cooling device monitoring and control unit detects an impending failure by detecting a change in current supplied to the fan.

20. The computer system of 14 wherein the cooling devices are fans, a temperature sensor is positioned proximate a point cooled by each fan and is coupled to the cooling device monitoring and control unit, and the cooling device monitoring and control unit detects an impending failure by detecting a temperature increase at a point cooled by the fan.

21. The computer system of claim 14 wherein the operating system generates a notification indicating that the impending failure has been detected and the affected processor has been deallocated upon being signaled by the cooling device monitoring and control unit to suspend execution of affected processes being executed by the affected processor.

22. The computer system of claim 14 wherein the cooling device monitoring and control unit is coupled to each cooling device and powers down a cooling device after signaling the processor power reduction unit to reduce power consumption of the affected processor, and powers up the cooling device after the impending or actual failure of the cooling device is rectified, and the operating system restores power consumption of the affected processor to a normal level and resumes execution of processes on the affected processor.

23. The computer system of claim 22 and further comprising:
an interrupt unit coupled to each processor;
wherein the operating system, upon being signaled by the cooling device monitoring and control unit to suspend execution of affected processes being executed by the affected processor also signals the interrupt unit to disable interrupts to the affected processor and reroutes all interrupt vectors to ensure that interrupt service routines are not executed by the affected processor, and after restoring power consumption of the affected processor to a normal level signals the interrupt unit to enable interrupts to the affected processor and reroutes interrupt vectors to allow interrupt service routines to be executed by the affected processor.

24. A computer system comprising:
a plurality of processors;
an operating system executing on one or more of the plurality of processors;
an interconnection fabric coupled to the plurality of processors;
a plurality of cooling devices, with each cooling device arranged to cool a processor;
a processor power reduction unit coupled to each processor; and
a cooling device monitoring and control unit coupled to the processor power reduction unit and configured to detect an impending failure of a cooling device that is coupled to an affected processor, wherein if an impending failure is detected, the cooling device monitoring and control unit:
signals the operating system to not schedule computationally intensive processes on the affected processor; and
signals the processor power reduction unit to place the affected processor in a low power mode that reduces power consumption of the affected processor to a level sufficient to maintain the affected processor at a non-critical temperature without assistance from the cooling device.

25. The computer system of claim 24 wherein the cooling device monitoring and control unit is coupled to each cooling device and powers down a cooling device before the impending or actual failure of the cooling device is rectified, and powers up the cooling device after the impending or actual failure of the cooling device is rectified, and the operating system restores power consumption of the affected processor to a normal level and resumes normal scheduling of processes for execution on the affected processor.

* * * * *